(12) United States Patent
Heussi

(10) Patent No.: US 7,791,899 B2
(45) Date of Patent: Sep. 7, 2010

(54) INSTALLATION AND WITHDRAWAL APPARATUS

(75) Inventor: Georg Heussi, Jona (CH)

(73) Assignee: ELMA Electronic AG, Wetzikon (CH)

( * ) Notice: Subject to any disclaimer, the term of this patent is extended or adjusted under 35 U.S.C. 154(b) by 904 days.

(21) Appl. No.: 11/084,575

(22) Filed: Mar. 16, 2005

(65) Prior Publication Data
US 2005/0207135 A1 Sep. 22, 2005

(30) Foreign Application Priority Data
Mar. 19, 2004 (EP) ................................. 04405169

(51) Int. Cl.
*H05K 7/18* (2006.01)
(52) U.S. Cl. ..................................................... 361/801
(58) Field of Classification Search ................ 361/801, 361/802, 732–740; 439/327, 326
See application file for complete search history.

(56) References Cited
U.S. PATENT DOCUMENTS
4,626,823 A * 12/1986 Smith ........................ 338/199

5,309,325 A * 5/1994 Dreher et al. ................ 361/754
5,675,475 A * 10/1997 Mazura et al. ............... 361/798
7,027,309 B2 * 4/2006 Franz et al. .................. 361/798
2006/0067063 A1 * 3/2006 Stahl et al. ................... 361/754

FOREIGN PATENT DOCUMENTS
DE 7724549 U1 1/1978
DE 9314257.9 U1 3/1994
DE 20311072 U1 9/2003

* cited by examiner

*Primary Examiner*—Dean A. Reichard
*Assistant Examiner*—Abiy Getachew
(74) *Attorney, Agent, or Firm*—Townsend and Townsend and Crew, LLP

(57) ABSTRACT

An installation and withdrawal apparatus (1) for the plugging in and withdrawal of a plug-in assembly into or out of an assembly support includes an installation and withdrawal handle (2) and a bearing element (3) about which the installation and withdrawal handle (2) can be rotated. The installation and withdrawal apparatus (1) further includes a holding element (4) to hold the installation and withdrawal handle (2) in a position suitable for plugging in the plug-in assembly, with the holding element (4) being arranged on the bearing element (3).

17 Claims, 4 Drawing Sheets

INSTALLATION AND WITHDRAWAL APPARATUS

BACKGROUND OF THE INVENTION

The invention relates to an installation and withdrawal apparatus for the plugging in and removal of a plug-in assembly into or out of an assembly support as well as to a plug-in assembly having such an installation and withdrawal apparatus and to an assembly support having such a plug-in assembly.

Plug-in assemblies introducible into assembly supports have multiple plug connections on the rear side whose plug-in and removal forces have to be overcome on the plugging in or removal of the plug-in assembly. Plug-in assemblies are therefore usually provided with a lower and/or an upper installation and withdrawal handle in order to facilitate the plugging in and the removal. The installation and withdrawal handles are arranged rotatably and are supported at a structure of the assembly support at the front side such that the installation and withdrawal handles act as levers on the plugging in and removal. The installation and withdrawal handles must be fully pivoted out for the plugging in of a plug-in assembly as they otherwise impede the plugging in of the plug-in assembly into the assembly support or make it absolutely impossible. The position of the installation and removal handles can change unintentionally on a direct contact or on a more powerful movement of the plug-in assembly without appropriate precautions. In particular the upper installation and withdrawal handle tends to tilt downwardly due to gravity so that it has to be held tight on the plugging in of the plug-in assembly. Efforts are currently being made to introduce narrow-shaped, elongate installation and withdrawal handles to the market which can be manufactured in a favorably-priced manner. The problem arises with such installation and withdrawal handles of unintended inward pivoting to a special degree.

A plug-in assembly is known from document DE 203 11 072 U1 in which a blocking lever is hinged to a lever pulling handle and locks the lever pulling handle in the outwardly pivoted position and blocks it against unintended pivoting. This design is relatively complex. The lever pulling handle can also only be inwardly pivoted by simultaneously actuating the blocking lever, which complicates the operation.

SUMMARY OF THE INVENTION

It is an object of the present invention to provide an installation and withdrawal apparatus for the plugging in and removing of a plug-in assembly into or out of an assembly support which is protected against unintended inward pivoting, has a simple operation and can be manufactured economically favorably in comparison with installation and withdrawal apparatuses of the prior art.

A further object of the invention consists of providing a plug-in assembly having such an installation and withdrawal apparatus and an assembly support having such a plug-in assembly.

The installation and withdrawal apparatus in accordance with the invention for the plugging in and removal of a plug-in assembly into or out of an assembly support includes an installation and withdrawal handle, a bearing element about which the installation and withdrawal handle is rotatable and a holding apparatus having at least one holding element in order to hold the installation and withdrawal handle in a position suitable for the plugging in of the plug-in assembly, preferably in a partly or completely outwardly pivoted position. In the installation and withdrawal apparatus in accordance with the invention, the holding element is arranged in the region of the bearing element, for example in that the holding element is arranged at, on or in the bearing element.

In a preferred embodiment, the holding element is made as a spring, in particular as a leg spring or as a spring ring or as an O ring.

In a further preferred embodiment, the bearing element is made as a fitting shoulder screw or as a screw with a sleeve, for example with a removal sleeve. In a preferred embodiment variant, the width of the shoulder or sleeve is dimensioned such that the installation and withdrawal handle can be pressed towards a component of the plug-in assembly by means of the screw. In a further preferred embodiment variant, the shoulder or sleeve is made for the reception of a holding element. A spring or an O ring is preferably arranged on the bearing element in addition to the installation and withdrawal handle.

In a further embodiment variant, the installation and withdrawal apparatus additionally includes a second holding apparatus having a second holding element to hold the installation and withdrawal handle in a latched position, in particular in an inwardly pivoted position, when the plug-in assembly is inserted. The second holding element is preferably made as a spring, for example as a cranked leaf spring, and the spring is arranged e.g. to the side of the installation and withdrawal handle.

The invention further includes a plug-in assembly having at least one installation and withdrawal apparatus in accordance with the aforesaid description and an assembly support having such a plug-in assembly.

The installation and withdrawal apparatus has the advantage that it is held in the outwardly pivoted position by the first holding apparatus such that an unintentional inward pivoting is avoided on the movement of the plug-in assembly and the inward pivoting of the installation and withdrawal handles is only possible against noticeable resistance. If a leg spring is used as the holding element, its spring force has the effect that the installation and withdrawal apparatus is pivoted into the outwardly pivoted position as soon as the plug-in assembly is removed from the assembly support. The arrangement of the first holding element in the region of the bearing element permits a simple and space-saving design of the holding apparatus and a cost-favorable manufacture of the installation and withdrawal apparatus. A further advantage of the installation and withdrawal apparatus in accordance with the invention is the simple operation thereof. Only the resistance of the holding apparatus has to be overcome for the inward pivoting of the installation and withdrawing handle.

BRIEF DESCRIPTION OF THE DRAWINGS

The invention will be explained in more detail in the following with reference to the embodiment and to the drawing.

DESCRIPTION OF THE PREFERRED EMBODIMENTS

Figure 1:
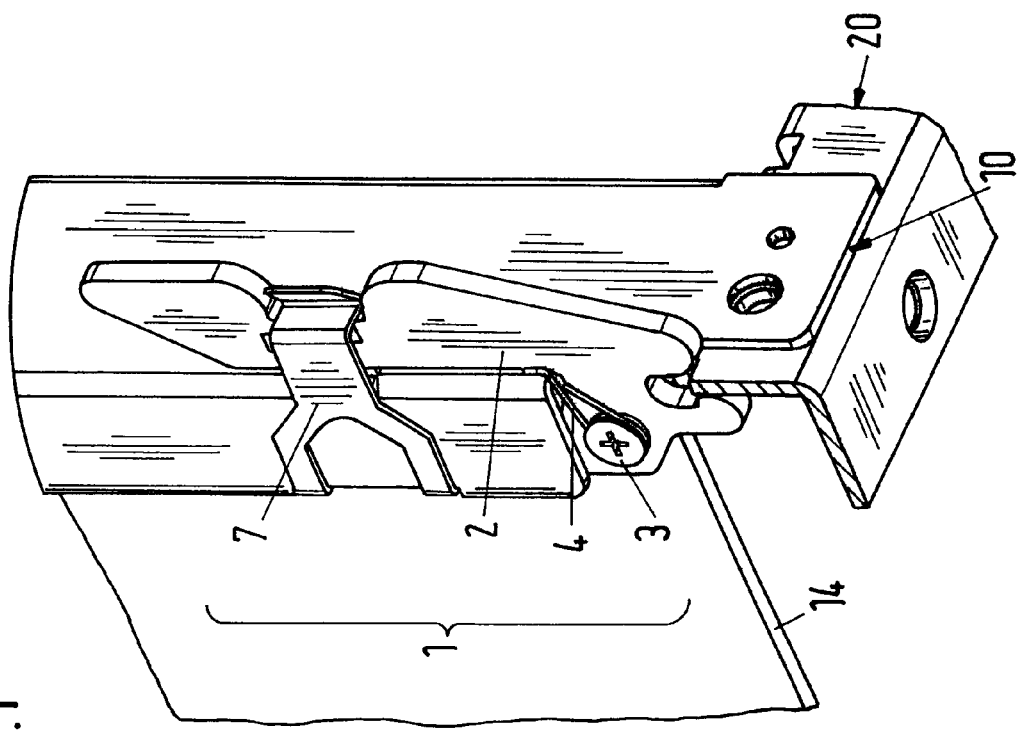
FIG. 1 is an oblique view of a section of a plug-in assembly with an embodiment of an installation and withdrawal apparatus in accordance with the present invention.

FIG. 1 shows an oblique view of a section of a plug-in assembly with an embodiment of an installation and withdrawal apparatus 1 in accordance with the present invention. The installation and withdrawal apparatus includes an installation and withdrawal handle 2 and a bearing element 3 about which the installation and withdrawal handle is rotatable and which can be made, for example, as a fitting shoulder screw or as a screw with a sleeve. The installation and withdrawal apparatus 1 further includes a holding apparatus having at least one holding element 4 which is formed as a leg spring in the embodiment shown in FIG. 1, the leg spring being arranged in the region of the bearing element 3 and surrounding it, for example.

Furthermore, in the section shown in FIG. 1, a front structure 10 and a printed-circuit board 14 of a plug-in assembly are shown as well as a front structure 20 of an assembly support into which the plug-in assembly has been inserted. The installation and withdrawal apparatus 1 is secured to the plug-in assembly in the lower region of the front structure 10 thereof such that the associated installation and withdrawal handle 2 can be pivoted forwardly or outwardly and, in the inwardly pivoted position thereof, the front structure 20 of the assembly support engages into a depression of the installation and withdrawal handle. On the outward pivoting of the installation and withdrawal handle 2, it is supported at the front structure 20 of the assembly support, whereby the plug-in assembly is pulled out of the assembly support. Conversely, the plug-in assembly can be inserted into the assembly support in a corresponding manner by inwardly pivoting the installation and withdrawal handle 2 on the insertion of the plug-in assembly.

In an embodiment variant, the installation and withdrawal apparatus 1 additionally includes a second holding apparatus having a second holding element 7 to hold and/or to latch the installation and withdrawal handle 2 in an inwardly pivoted position, when the plug-in assembly is inserted. The second holding element can be made as a spring, for example as a cranked leaf spring as shown in FIG. 1, which is e.g. arranged to the side of the installation and withdrawal handle.

Figure 2:
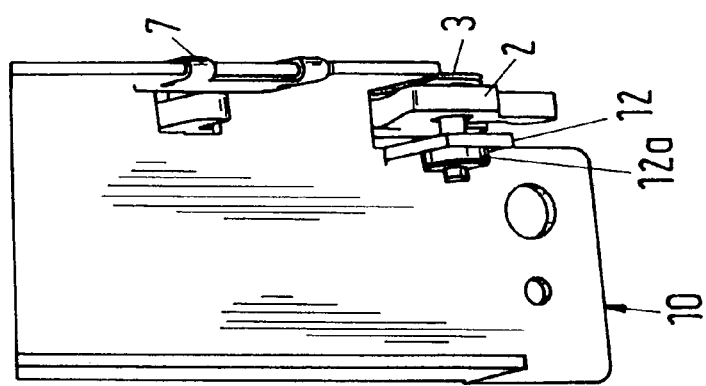
FIG. 2 is the section of FIG. 1 considered from the rear.

FIG. 2 shows the section of a plug-in assembly shown in FIG. 1 considered from the rear. The reference numerals of FIG. 1 have been retained. In particular the installation and withdrawal handle 2, the bearing element 3 and the rear part of the second holding element 7 of the installation and withdrawal apparatus are visible in FIG. 2. Furthermore, the front structure 10 and a securing part 12 of the plug-in assembly are visible, the securing part being attached to the front structure in the embodiment and being able to be made, for example, as a latched tab of the front structure. The securing part advantageously has an opening, e.g. an opening with a collar, or a pressed-in sleeve into which the bearing element 3 can be inserted, pressed or screwed. In FIG. 2, the printed circuit board 14 shown in FIG. 1 is not shown, since it would cover a larger part of FIG. 2. On the other hand, the installation and withdrawal handle 2 is shown spaced apart from the securing part 12 in FIG. 2 to indicate that a printed circuit board can be fitted at this position.

Figure 3:
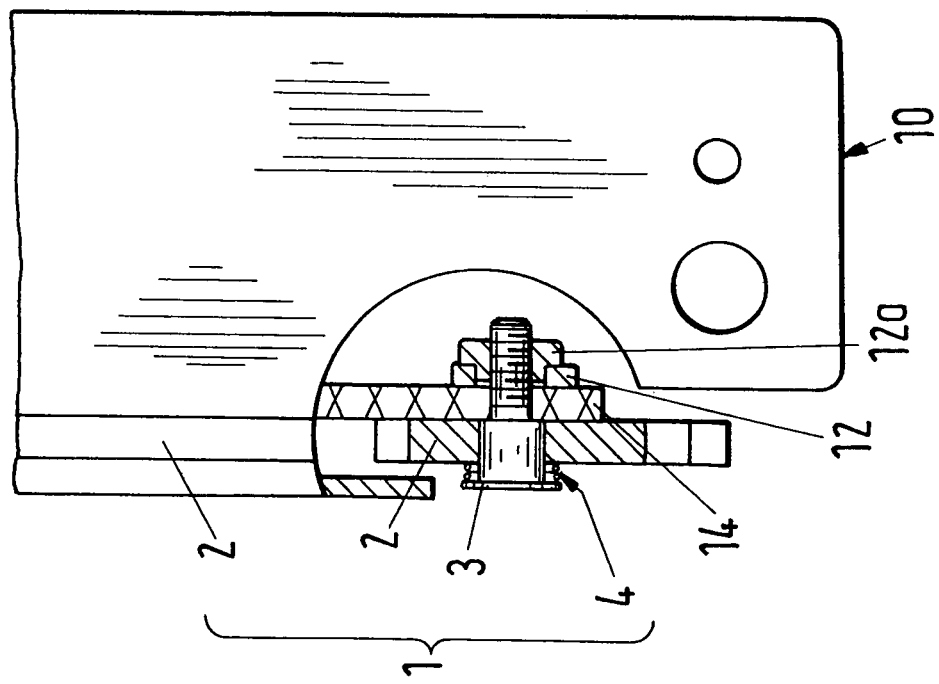
FIG. 3 is a detailed view of a section through a bearing element with respect to the embodiment in FIG. 1, considered through an opening in the front structure of the plug-in assembly.

FIG. 3 shows a detailed view of a section through a bearing element 3 with respect to the embodiment shown in FIG. 1. An opening (not actually present) is drawn at the appropriate position in the front structure 10 of the plug-in assembly to allow a view of the section. The installation and withdrawal apparatus 1 includes an installation and withdrawal handle 2, a bearing element 3, which can be formed, for example, as a fitting shoulder screw or as a screw with sleeve, and a holding element 4 which can e.g. be made as a spring, for example as a leg spring, a helical spring with legs or as a spring ring. The plug-in assembly further includes a securing part 12 having an opening 12a, in particular having a threaded part to secure the bearing element 3, and a printed circuit board 14 which is advantageously secured to the bearing element 3 at the securing part 12, for example in that the bearing element is provided with a shoulder by means of which the printed circuit board is pressed towards the securing part 12.

Figure 4:
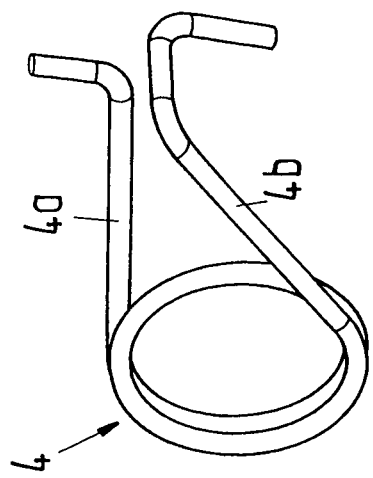
FIG. 4 is an oblique view of an embodiment variant of a leg spring with respect to the embodiment shown in FIG. 1.

FIG. 4 shows an oblique view of an embodiment variant of a leg spring 4 such as is used e.g. in the embodiment shown in FIG. 1. The leg spring 4 preferably includes at least one winding of a helical spring and two legs 4a, 4b which can be bent or cranked at their outer end. In the embodiment of FIG. 1, the cranked end of the one leg is anchored to the lever 2 while the cranked end of the other leg is supported at the front structure 10 of the plug-in assembly.

Figure 5:
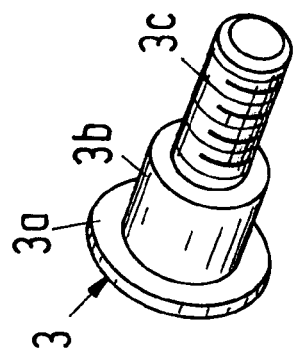
FIG. 5 is an oblique view of an embodiment variant of a fitting shoulder screw with respect to the embodiment shown in FIG. 1.

In the embodiment variant of a fitting shoulder screw shown in FIG. 5, it includes a screw head 3a, a shoulder 3b and a threaded part 3c which are arranged coaxially to one another in a row, with the screw head having the largest diameter, the shoulder having a medium diameter and the threaded part having the smallest diameter. The shoulder is advantageously made to receive the holding element so that a holding element, for example a spring or an O ring, can be arranged on the shoulder in addition to the installation and withdrawal handle. In a preferred embodiment variant, the width of the shoulder is dimensioned such that the installation and withdrawal handle can be pressed towards a component, for example towards a securing part 12 or a printed circuit board 14, of the plug-in assembly by means of the screw. In a further preferred embodiment variant, which can be used, for example, in the embodiment shown in FIGS. 1 and 3, the winding of a helical spring 4 with legs and the installation and withdrawal handle 2 are arranged on the shoulder and the width of the shoulder is dimensioned such that the installation and withdrawal handle can be outwardly pivoted by means of the helical spring.

Figure 6:
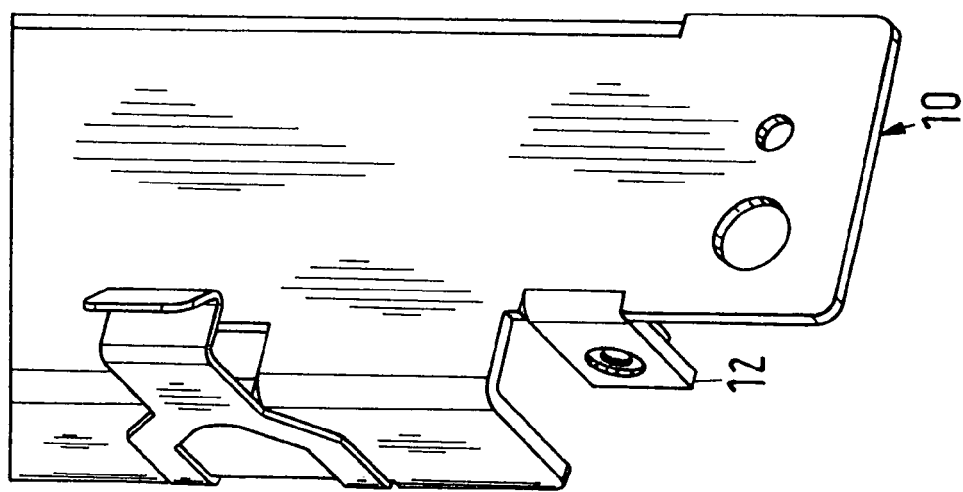
FIG. 6 is an oblique view of an embodiment variant of a front structure with respect to the plug-in assembly shown in FIG. 1.

FIG. 6 shows an oblique view of a preferred embodiment variant of a front structure with respect to the plug-in assembly shown in FIG. 1. The front structure 10 in this embodiment variant includes a securing part 12 which is connected to the front structure and serves for the securing of a bearing element, for example of a fitting shoulder screw of the installation and withdrawal apparatus described above. The securing part 12 can be made, for example, as a latched tab of the front structure 10.

Figure 7:
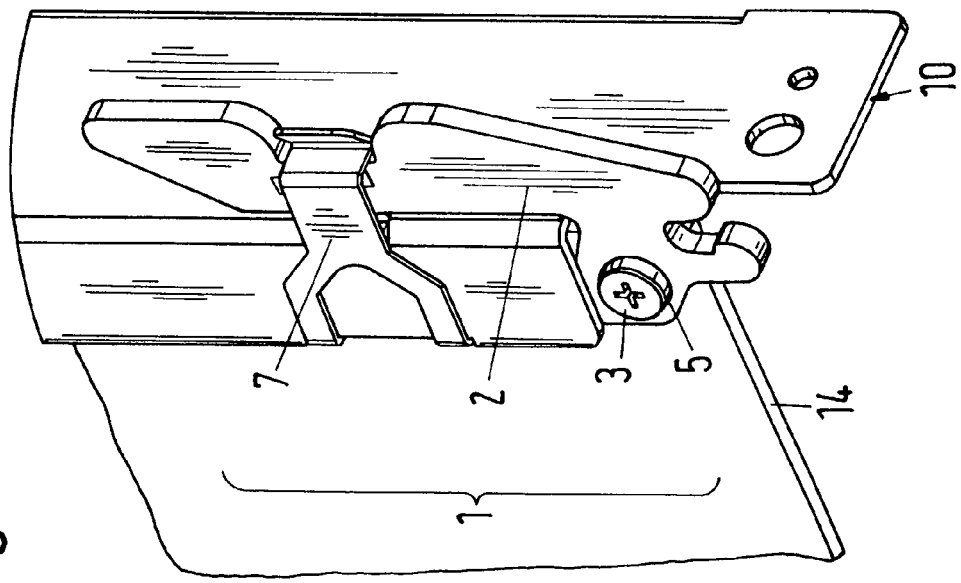
FIG. 7 is an oblique view of a section of a plug-in assembly with a second embodiment of an installation and withdrawal apparatus in accordance with the present invention.

FIG. 7 shows an oblique view of a section of a plug-in assembly with a second embodiment of an installation and withdrawal apparatus 1 in accordance with the present invention. The installation and withdrawal apparatus in the second embodiment includes an installation and withdrawal handle 2 and a bearing element 3 about which the installation and withdrawal handle is rotatable and which can be made, for example, as a fitting shoulder screw or as a screw with a sleeve. The installation and withdrawal apparatus 1 further includes a holding apparatus having at least one holding element 5 which is formed as an O ring arranged on the bearing element 3 in the second embodiment. As necessary, the installation and withdrawal apparatus 1 additionally includes a second holding apparatus having a second holding element 7 to hold and/or to latch the installation and withdrawal handle 2 in an inwardly pivoted position, when the plug-in assembly is inserted. A front structure 10 and a printed circuit board 14 of a plug-in assembly are further shown in the section shown in FIG. 7.

Figure 8:
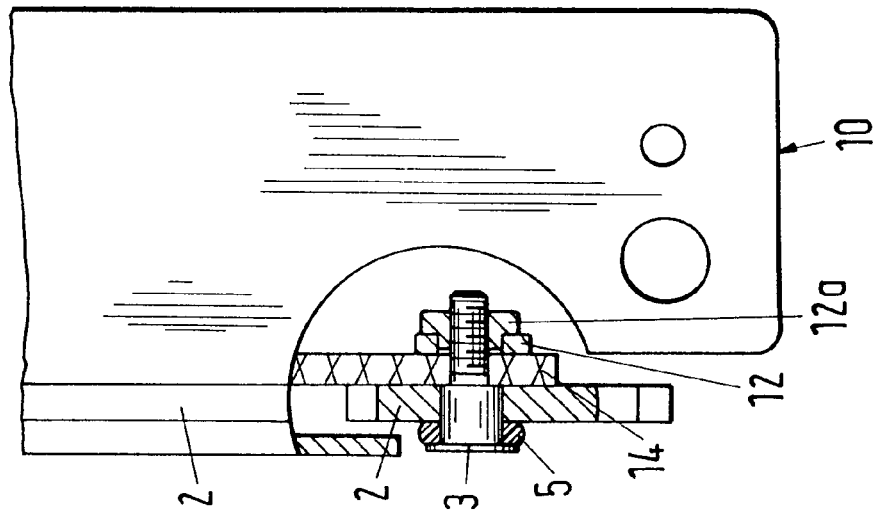
FIG. 8 is a detailed view of a section through a bearing element with respect to the embodiment shown in FIG. 7, considered through an opening in the front structure of the plug-in assembly.

FIG. 8 shows a detailed view of a section through a bearing element 3 with respect to the embodiment shown in FIG. 7. An opening (not actually present) is drawn at the appropriate position in the front structure 10 of the plug-in assembly to allow a view of the section. The installation and withdrawal apparatus 1 includes an installation and withdrawal handle 2, a bearing element 3, which can be formed, for example, as a fitting shoulder screw or as a screw with a sleeve, and a holding element 5 which is made as an O ring in this embodiment. The plug-in assembly further includes a securing part 12 having an opening 12a, in particular having a threaded part to secure the bearing element 3, and a printed circuit board 14 which is advantageously secured to the bearing element 3 at the securing part 12, for example in that the bearing element is provided with a shoulder by means of which the printed circuit board is pressed towards the securing part 12. The width of the shoulder is advantageously dimensioned such that the installation and withdrawal handle 2 can be pressed towards a component of the plug-in assembly by means of the screw.

The arrangement of the first holding element in the region of the bearing element has the advantage that the holding apparatus can be designed in a simple and space-saving manner and permits a cost-favorable manufacture of the installation and withdrawal apparatus. The circumstance that the bearing element can simultaneously satisfy a plurality of functions, e.g. as a bearing for the installation and withdrawal handle, as a securing element for a printed circuit board or as a pressing and/or centring part for the holding apparatus, also has a cost-reducing effect. A further advantage of the installation and withdrawal apparatus in accordance with the invention is the simple operation thereof in that only the resistance of the holding apparatus has to be overcome to inwardly pivot the installation and withdrawal handle.

The invention claimed is:

1. An installation and withdrawal apparatus for plugging in and removing a plug-in assembly having a flat mounting surface into or out of a support structure comprising a bearing member for attachment to a portion of the mounting structure, a flat handle including a flat face in direct contact with the flat surface of the plug-in assembly and pivotable about the bearing member between a locked position in which the handle secures the plug-in assembly to the support structure and an unlocked position in which the plug-in assembly is movable relative to the support structure, and a holder cooperating with the handle and the plug-in assembly resiliently maintaining the handle in its unlocked position and permitting movement of the handle between its locked and unlocked positions, the handle including a notch having an open side configured and positioned to engage the support structure when the handle is in its locked position to thereby secure the handle and therewith the plug-in assembly in the locked position.

2. An installation and withdrawal apparatus in accordance with claim 1 wherein the bearing member comprises a threaded bolt about which the handle pivots.

3. An installation and withdrawal apparatus in accordance with claim 2 wherein the bolt includes a cylindrical portion pivotally engaged by the handle and a head disposed on the side of the handle not facing the plug-in assembly.

4. An installation and withdrawal apparatus in accordance with claim 1 wherein the flat surface of the plug-in assembly is substantially parallel to a direction of movement of the plug-in assembly into and out of the support structure.

5. An installation and withdrawal apparatus for plugging in and removing a plug-in assembly having a mounting surface into or out of an assembly support comprising an installation and withdrawal handle, a screw member pivotally movably mounting the installation and withdrawal handle and provided for securing to the mounting surface, and a holding apparatus having a holding element arranged in a region of the screw member holding the installation and withdrawal handle in a position suitable for the plugging in of the plug-in assembly.

6. An installation and withdrawal apparatus according to claim 5 wherein the screw member comprises one of a shoulder screw having a shoulder and a screw with a sleeve.

7. An installation and withdrawal apparatus for plugging in and removing a plug-in assembly having a flat mounting surface into or out of a support structure, said support structure comprising a mounting structure, a handle attached to the mounting structure using a bearing member and being substantially parallel to said support structure, said handle being disposed on one side of said support structure, said bearing member comprising a shoulder screw and a cooperating nut, said handle being pivotable about the bearing member between a locked position in which the handle secures the plug-in assembly to the support structure and an unlocked position in which the plug-in assembly is movable relative to the support structure, said handle being secured in its locked position by a second holding element comprising a spring connecting the support structure to the holder, said handle being biased towards the open position by a resilient holder which is mounted around said bearing member, said holder comprising one of a leg spring, a spring ring and an O ring.

8. An installation and withdrawal apparatus in accordance with claim 1, wherein the holder includes one of a leg spring, a spring ring and an O ring and arranged in one of the region of the bearing member and on the bearing member.

9. An installation and withdrawal apparatus in accordance with claim 1, wherein one of a spring and an O ring is arranged on the bearing member in addition to the flat handle.

10. An installation and withdrawal apparatus in accordance with claim 1, additionally including a second holder to hold the flat handle in a latched position, when the plug-in assembly is inserted.

11. An installation and withdrawal apparatus in accordance with claim 10 wherein the second holder includes a cranked leaf spring.

12. An assembly support including at least one installation and withdrawal apparatus in accordance with claim 1.

13. An installation and withdrawal apparatus in accordance with claim 6, wherein one of a spring and an O ring is arranged on the screw member in addition to the installation and withdrawal handle.

14. An installation and withdrawal apparatus in accordance with claim 5, wherein the holding apparatus includes one of a leg spring, a spring ring and an O ring and arranged in one of the region of the screw member and on the screw member.

15. An installation and withdrawal apparatus in accordance with claim 5, additionally including a second holder to hold the installation and withdrawal handle in a latched position, when the plug-in assembly is inserted.

16. An installation and withdrawal apparatus in accordance with claim 15 wherein the second holder includes a cranked leaf spring.

17. An assembly support including at least one installation and withdrawal apparatus in accordance with claim 5.

* * * * *